United States Patent
Cho et al.

(10) Patent No.: US 7,304,520 B2
(45) Date of Patent: Dec. 4, 2007

(54) DELAY CIRCUIT AND SEMICONDUCTOR DEVICE INCLUDING SAME

(75) Inventors: Young-Chul Cho, Suwon-si (KR);
Joung-Yeal Kim, Yongin-si (KR);
Sung-Hoon Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/332,148

(22) Filed: Jan. 17, 2006

(65) Prior Publication Data

US 2006/0273839 A1    Dec. 7, 2006

(30) Foreign Application Priority Data

May 17, 2005    (KR) .................. 10-2005-0041322

(51) Int. Cl.
*H03H 11/26* (2006.01)
(52) U.S. Cl. .................. 327/277; 327/264; 327/278
(58) Field of Classification Search ................ 327/261, 327/263, 264, 269, 270, 276–278
See application file for complete search history.

(56) References Cited

U.S. PATENT DOCUMENTS

| | | | | |
|---|---|---|---|---|
| 5,389,843 A | * | 2/1995 | McKinney .................. 327/276 |
| 5,521,499 A | * | 5/1996 | Goldenberg et al. ........ 327/237 |
| 6,154,079 A | * | 11/2000 | Lee et al. .................. 327/276 |
| 6,169,438 B1 | * | 1/2001 | Wu et al. .................. 327/276 |
| RE37,232 E | * | 6/2001 | Saeki .................. 327/261 |
| 6,459,319 B2 | * | 10/2002 | Sako .................. 327/276 |
| 6,525,585 B1 | * | 2/2003 | Iida et al. .................. 327/279 |
| 6,879,200 B2 | * | 4/2005 | Komura et al. ............ 327/278 |
| 7,173,468 B2 | * | 2/2007 | Collins et al. ............. 327/284 |
| 7,205,803 B2 | * | 4/2007 | Chung et al. ............... 327/158 |

FOREIGN PATENT DOCUMENTS

| | | |
|---|---|---|
| JP | 05-129911 | 5/1993 |
| JP | 2002-042466 | 2/2002 |
| JP | 2003-008412 | 1/2003 |
| KR | 10-1998-025567 | 7/1998 |
| KR | 10-1998-082862 | 12/1998 |
| KR | 10-1999-018191 | 3/1999 |
| KR | 1020040092722 | 11/2004 |

\* cited by examiner

*Primary Examiner*—Kenneth B. Wells
*Assistant Examiner*—William Hernandez
(74) *Attorney, Agent, or Firm*—Volentine & Whitt, PLLC

(57) ABSTRACT

A delay circuit comprises a plurality of delay blocks connected in series, and a driving portion adapted to logically combine signals transmitted by the plurality of delay blocks to generate a delay circuit output signal. Each of the plurality of delay blocks delays an output signal from an immediately previous delay block and transmits a resulting delayed output signal to a next delay block when a delay operation is enabled based on a corresponding control signal. However, where the delay operation of a delay block is disabled based on the corresponding control signal, the delay block transmits the output signal of the immediately previous delay block to the driving portion.

19 Claims, 10 Drawing Sheets

DELAY CIRCUIT AND SEMICONDUCTOR DEVICE INCLUDING SAME

BACKGROUND OF THE INVENTION

1. Field of the Invention

The present invention relates generally to a delay circuit. More particularly, the invention relates to a delay circuit adapted to maintain a constant minimum delay time even where the number of delay blocks in the delay circuit increases, and to delay an input signal only through selected delay blocks.

A claim of priority is made to Korean Patent Application No. 10-2005-0041322, filed May 17, 2005, the disclosure of which is hereby incorporated by reference in its entirety.

2. Description of Related Art

As the operating speed of semiconductor devices increases, the impact of small differences in a characteristic margin between signals in the semiconductor devices tends to increase accordingly. As a result, semiconductor devices often include a delay circuit having a plurality of delay blocks adapted to precisely control the timing of the signals within a signal path. The delay blocks are controlled by respective control signals to adjust a delay time of the delay circuit, thereby optimizing the characteristic margin between the signals.

FIG. 1 is a block diagram illustrating a conventional delay circuit. Referring to FIG. 1, the delay circuit comprises a plurality of delay blocks 11 through 1n. The term "block" here simply refers to a portion of the delay circuit. In general, the portion defined by a "block" can be defined by an arbitrary partition of the delay circuit. In addition, the notation "X1Y through XnY" is used throughout this written description to denote first through n-th elements. For example, delay blocks 11 through 1n comprise $1_{st}$ through n-th delay blocks.

Delay blocks 11 through 1n include respective switches 111 through 1n1, unit delay cells 112 through 1n2, and drivers 113 through 1n3. Delay blocks 11 through 1n are enabled in response to control signals F1 through Fn to delay respective input signals. The input signal for delay block 11 is an input signal "in" and the input signals for respective delay blocks 12 through 1n are output signals of respective previous delay blocks 11 through 1(n−1). Accordingly, input signal "in" is delayed by delay blocks 11 through 1n based on control signals F1 through Fn. Where delay blocks 11 through 1n are disabled according to control signals F1 through Fn, the input signals are transmitted through delay blocks 11 through 11n without delay.

To control whether delay blocks 11 through 1n delay their respective input signals, switches 111 through 1n1 include first transmission paths P111 through P1n1, which are connected directly to drivers 113 through 1n3, and second transmission paths P112 through P1n2, which are connected to drivers 113 through 1n3 via unit delay cells 112 through 1n2. Switches 111 through 1n1 transmit their respective input signals through respective second transmission paths P112 through P1n2 when delay blocks 11 through 1n are enabled, and switches 111 through 1n1 transmit their respective input signals through respective first transmission paths P111 through P1n1 when delay blocks 11 through 1n are disabled.

Unit delay cells 112 through 1n2 are respectively connected to drivers 113 through 1n3 via second transmission paths P112 through P1n2. Unit delay cells 112 through 1n2 delay signals transmitted along second transmission paths P112 through P1n2 by a unit of time and transmit resulting delayed signals to drivers 113 through 1n3. Drivers 113 through 1n3 combine respective signals transmitted through first and second transmission paths P111 through P1n1 and P112 through P1n2 to generate combined signals. Drivers 113 through 1(n−1)3 then transmit the respective combined signals to subsequent delay blocks 12 through 1n. Driver 1n3 transmits its combined signal as an output signal "out".

Control signals F1 through Fn are typically generated by signal generator using a fuse program or a mode setting operation.

FIG. 2 is a circuit diagram illustrating the delay circuit of FIG. 1 in further detail.

Referring to FIG. 2, switches 111 through 1n1 include inverters I11 through I1n for inverting control signals F1 through Fn and first NAND gates N111 through N1n1 for computing a NAND operation on respective inverted control signals /F1 through /Fn and the respective input signals to delay blocks 11 through 1n and transmitting respective resulting output signals to first transmission paths P1 through P1n1. Switches 111 through 1n1 further include respective second NAND gates N112 through N1n2 for computing a NAND operation on respective control signals F1 through Fn and the respective input signals of delay blocks 11 through 1n and transmitting respective resulting output signals to second transmission paths P112 through P1n2. Unit delay cells 112 through 1n2 include elements (not shown) for delaying an input signal by a predetermined unit of time.

Drivers 113 through 1n3 include respective third NAND gates N113 through N1n3 for computing NAND operations on respective signals transmitted through first and second transmission paths P1 through P1n1 and P112 through P1n2 and transmitting respective resulting output signals to subsequent delay blocks 12 through 1n.

The operation of the delay circuit of FIG. 2 is explained below with reference to FIG. 3.

In FIG. 3, it is assumed that a delay operation for a particular delay block is enabled when a corresponding control signal has a logic level "high" (denoted "H" in FIG. 3), and the delay operation is disabled when the corresponding control signal has a logic level "low" (denoted "L" in FIG. 3). In FIG. 3, "dn" denotes a delay associated with each NAND gate in FIG. 2, and "du" denotes a delay associated with each unit delay cell 112 through 1n2.

Referring to FIG. 3, control signals F1 through Fn are initially applied to respective delay blocks 11 through 1n with logic level "low". As a result, the input signals to delay blocks 11 through 1n are delayed as follows.

First delay block 11 receives input signal "in" and generates an inverted input signal /in which is delayed by delay time dn through first NAND gate N111. A resulting output signal from first NAND gate N111 is then input to third NAND gate N111, which further delays the output signal from first NAND gate N111 to generate an input signal for delay block 12, which is delayed by a time a delay time "2dn" relative to input signal "in". The input signal for delay block 12 is apparent at a node N1. Remaining delay blocks 12 through 1n operate in the same was as delay block 11 to delay their respective input signals by a delay time "2dn" and transmit signals with accumulated delay times to respective nodes N2 through Nn.

As a result, even where delay blocks 11 through 1n are all disabled, input signal "in" is delayed by a delay time "2dn×n" after being transmitted through respective first and third NAND gates N111 through N1n1 and N113 through N1n3 of the first to n-th delay blocks 11 through 1n. In other words, a minimum delay time for the delay circuit is "2dn×n". Here, the minimum delay time is referred to as a time which the delay circuit delays the input signal in when all of delay blocks 11 through in are disabled.

Referring still to FIG. 3, control signal F1 subsequently transitions to logic level "high" to enable delay block 11. As a result, input signal "in" is delayed as follows.

First delay block 11 receives input signal "in" and generates an inverted input signal /in which is delayed by a delay time "dn+du" through second NAND gate N112 and unit delay cell 112. A resulting output signal from second NAND gate N112 is further delayed by a delay time "2dn+du" through third NAND gate N113, and transmitted to node N1. Since remaining delay blocks 12 through 1n are disabled, they each further delay input signal "in" by a delay time "2dn" and transmit respective output signals with accumulated delay times to nodes N2 to Nn. As a result, the delay circuit delays input signal "in" by an overall delay time "(2dn×n)+du".

Where the delay circuit enables "m" delay blocks, where m is a natural number greater than 1 and less than or equal to n, the delay circuit delays input signal "in" by a delay time of "(2dn×n)+(du×m)".

The conventional delay circuit serially connects a plurality of delay blocks and adjusts the number of the enabled delay blocks to delay the input signal by a desired delay time.

However, since the delay circuit contains a plurality of serially connected delay blocks, input signal "in" must be transmitted through all of the delay blocks. Thus, even where the delay circuit does not perform a delay operation, input signal "in" is still transmitted through all of the delay blocks and thus is unnecessarily delayed by the minimum delay time.

In addition, since the minimum delay time increases in proportion to the number of the delay blocks in the delay circuit, the minimum delay time also increases as the number of the delay blocks increases.

SUMMARY OF THE INVENTION

Selected embodiments of the present invention provide a delay circuit capable of maintaining a constant minimum delay time even where the number of delay blocks in the delay circuit is increased, and further capable of delaying an input signal only through selected delay blocks.

In addition, selected embodiments of the invention also provide a semiconductor device having a delay circuit which can maintain a constant minimum delay time even where the number of delay blocks is increased, and capable of delaying an input signal only through selected delay blocks.

According to one embodiment of the invention, a delay circuit comprises a plurality of delay blocks connected in series and a driving portion adapted to logically combine output signals transmitted from the plurality of delay blocks to generate a delay circuit output signal. Each of the plurality of delay blocks receives an output signal generated by an immediately previous delay block as an input signal and delays the input signal to produce an output signal. In addition, each of the plurality of delay blocks transmits its respective output signal to a next delay block when a delay operation of the delay block is enabled based on a corresponding control signal, and transmits its input signal to the driving portion when the delay operation of the delay block is disabled based on the corresponding control signal.

According to another embodiment of the invention, a delay circuit comprises a plurality of delay blocks, which are connected in series and a driving portion adapted to logically combine signals transmitted from the plurality of delay blocks to generate a delay circuit output signal. Each of the plurality of delay blocks receives an output signal from an immediately previous delay block as an input signal and transmits the input signal to a next delay block when a delay operation of the delay block is enabled based on a corresponding control signal, and delays the input signal and transmits the delayed input signal to the driving portion when the delay operation is disabled based on the corresponding control signal. According to still another embodiment of the invention, a semiconductor device comprises a delay circuit adapted to select a subset of delay blocks among a plurality of delay blocks based on a plurality of control signals, and further adapted to delay a delay circuit input signal through the subset of delay blocks, and a control signal generating circuit adapted to generate a plurality of control signals for selecting the subset of delay blocks.

BRIEF DESCRIPTION OF THE DRAWINGS

The invention is described below in relation to several embodiments illustrated in the accompanying drawings. Throughout the drawings like reference numbers indicate like exemplary elements, components, or steps. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

Figure 1:
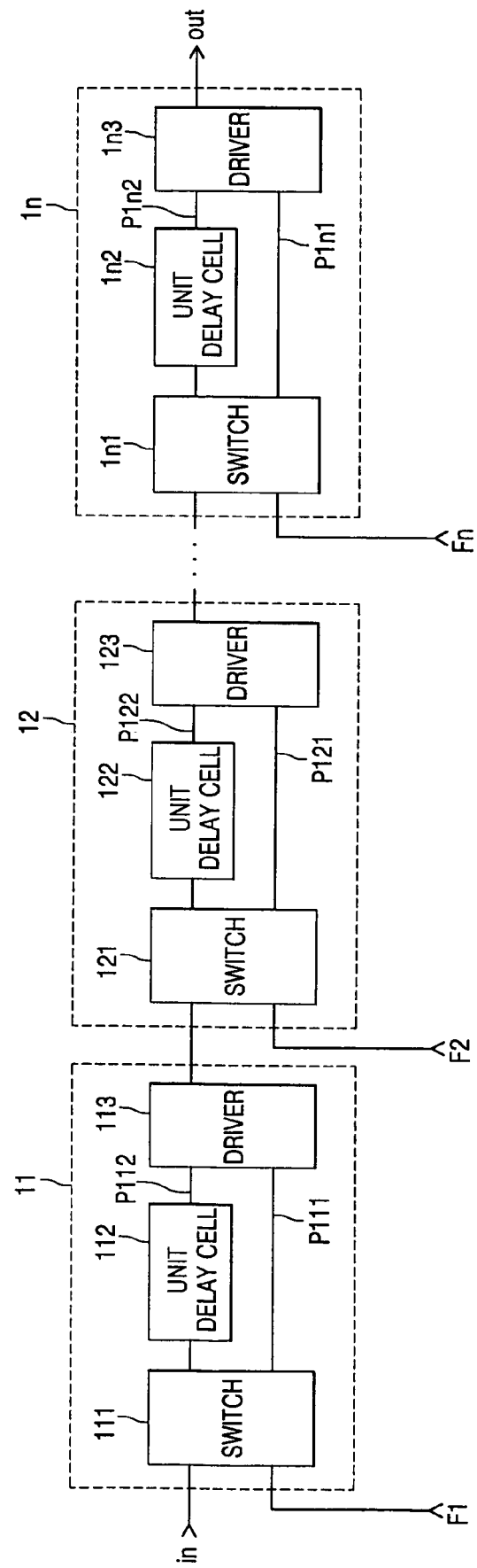
FIG. 1 is a block diagram illustrating a conventional delay circuit.
Figure 2:
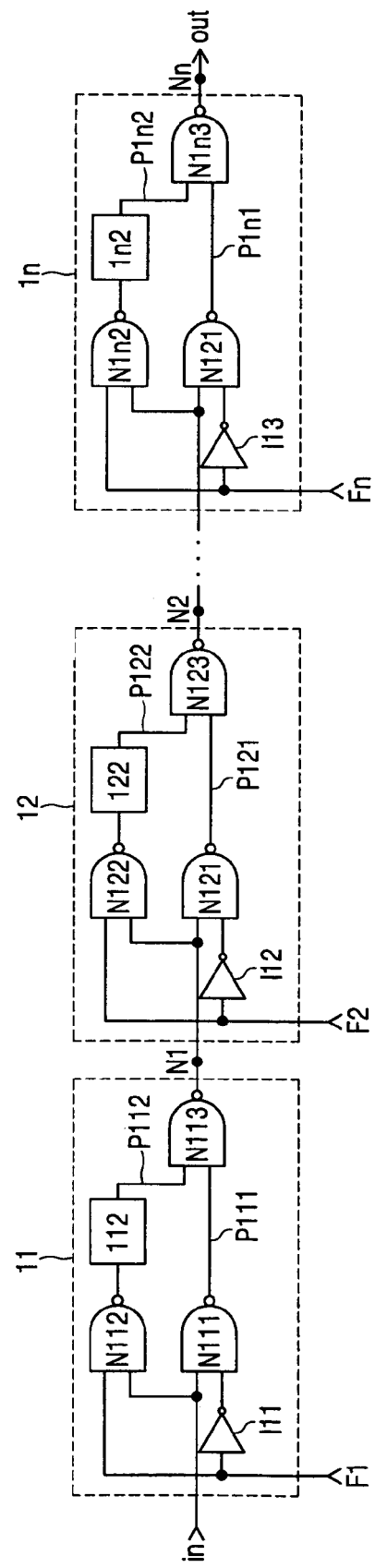
FIG. 2 is a circuit diagram illustrating the conventional delay circuit of FIG. 1 in further detail.
Figure 3:
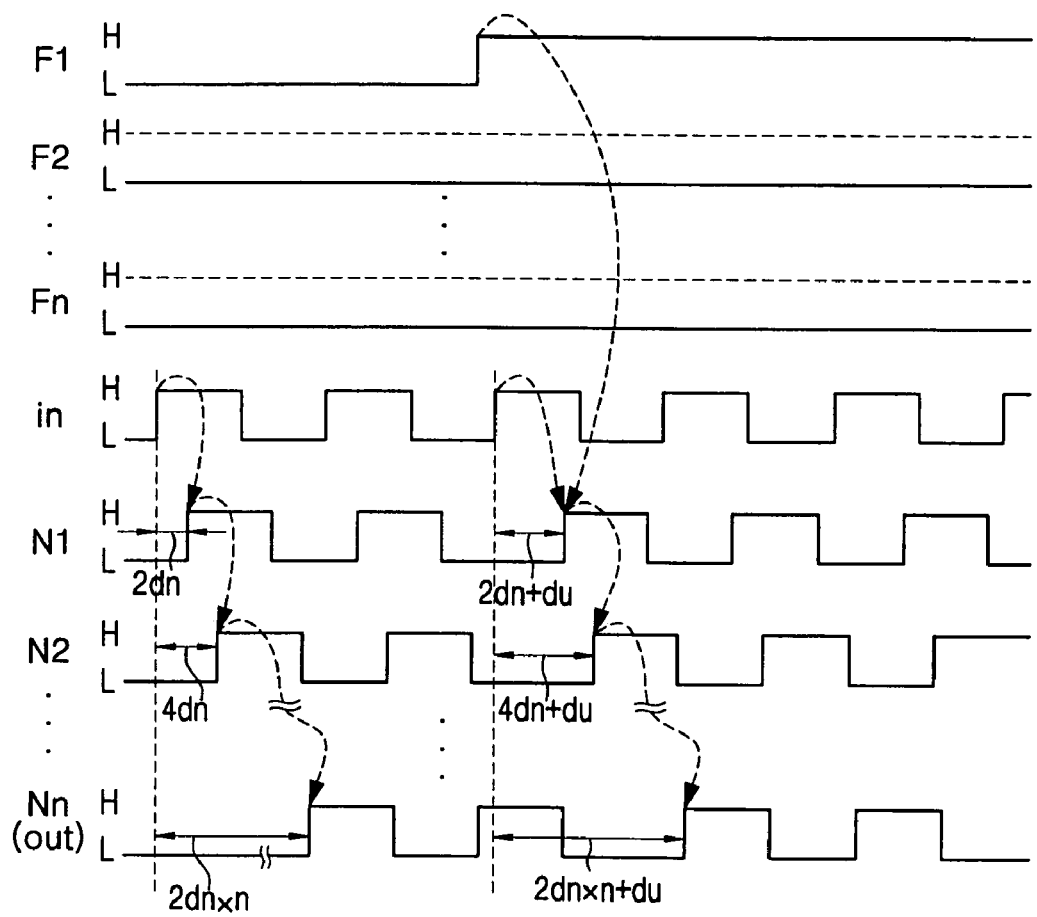
FIG. 3 is a timing diagram illustrating the operation of the delay circuit shown in FIG. 2.
Figure 4:
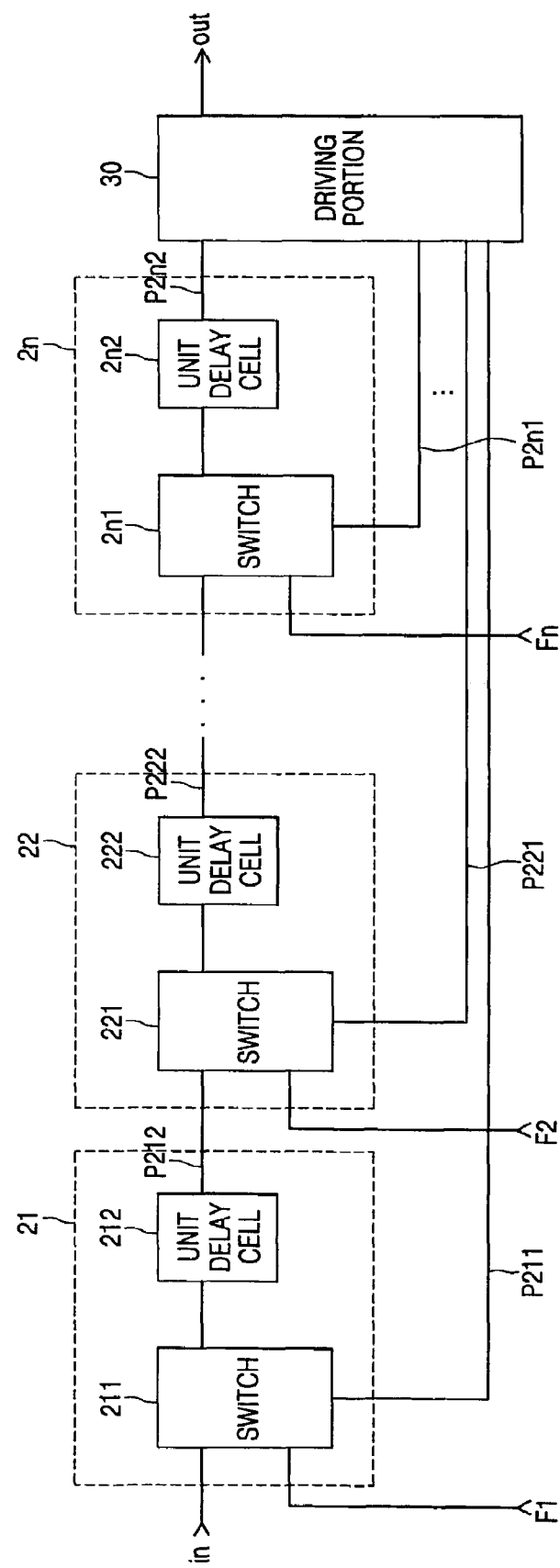
FIG. 4 is a block diagram illustrating a delay circuit according to one embodiment of the present invention.

FIG. 4 is a block diagram illustrating a delay circuit according to one embodiment of the present invention. Referring to FIG. 4, the delay circuit includes a plurality of delay blocks 21 through 2n, which are serially connected to each other, and a driving portion 30 which is connected in parallel with delay blocks 21 through 2n. Delay blocks 21 through 2n include respective switches 211 through 2n1 and unit delay cells 212 through 2n2.

Delay blocks 21 through 2n also include first transmission paths P211 through P2n1, which are directly connected to driving portion 30, and second transmission paths P212 through P2n2, which are connected between successive delay blocks 21 through 2n and between delay block 2n and driving portion 30. Delay blocks 21 through 2n are enabled by control signals F1 to Fn to delay their respective input signals. The input signal for delay block 21 is an input signal "in" for the delay circuit, and the input signals for respective delay blocks 22 through 2n are output signals of previous delay blocks, i.e., respective delay blocks 21 through 2(n−1). Where one of delay blocks 21 through 2n is disabled, the delay block transmits its input signal to driving portion 30 without any further delay.

To transmit the input signal of a delay block to driving portion 30, switches 211 through 2n1 include first transmission paths P211 through P2n1, which are directly connected to driving portion 30, and second transmission paths P212 through P2n2, which are connected to respective subsequent delay blocks 22 through 2n via unit delay cells 212 through 2n2. Where delay blocks 21 through 2n are enabled, switches 211 through 2n1 transmit the respective input signals of delay blocks 21 through 2n to unit delay cells 212 through 2n2. In contrast, where delay blocks 21 through 2n are disabled by control signals F1 through Fn, switches 211 through 2n1 transmit the respective input signals of delay blocks 21 through 2n1 to driving portion 30 via respective first transmission paths P211 through P2n1. Unit delay cells 212 through 2n2 are connected to the subsequent delay blocks 22 through 2n via second transmission paths P212 through P2n2, and delay respective signals transmitted via first transmission paths P211 through P2n1 for a predetermined unit of time and transmit resulting delayed signals to driving portion 30. Here, since the delay block 2n is the last delay block, second transmission path P2n2 is connected to the driving portion 30.

Driving portion 30 is connected in parallel with first transmission paths P211 through P2n1 and second transmission path P2n2. Driving portion 30 logically combines signals transmitted through transmission paths P211 through P2n1 and second transmission path P2n2 to generate a time-delayed output signal.

Figure 5:
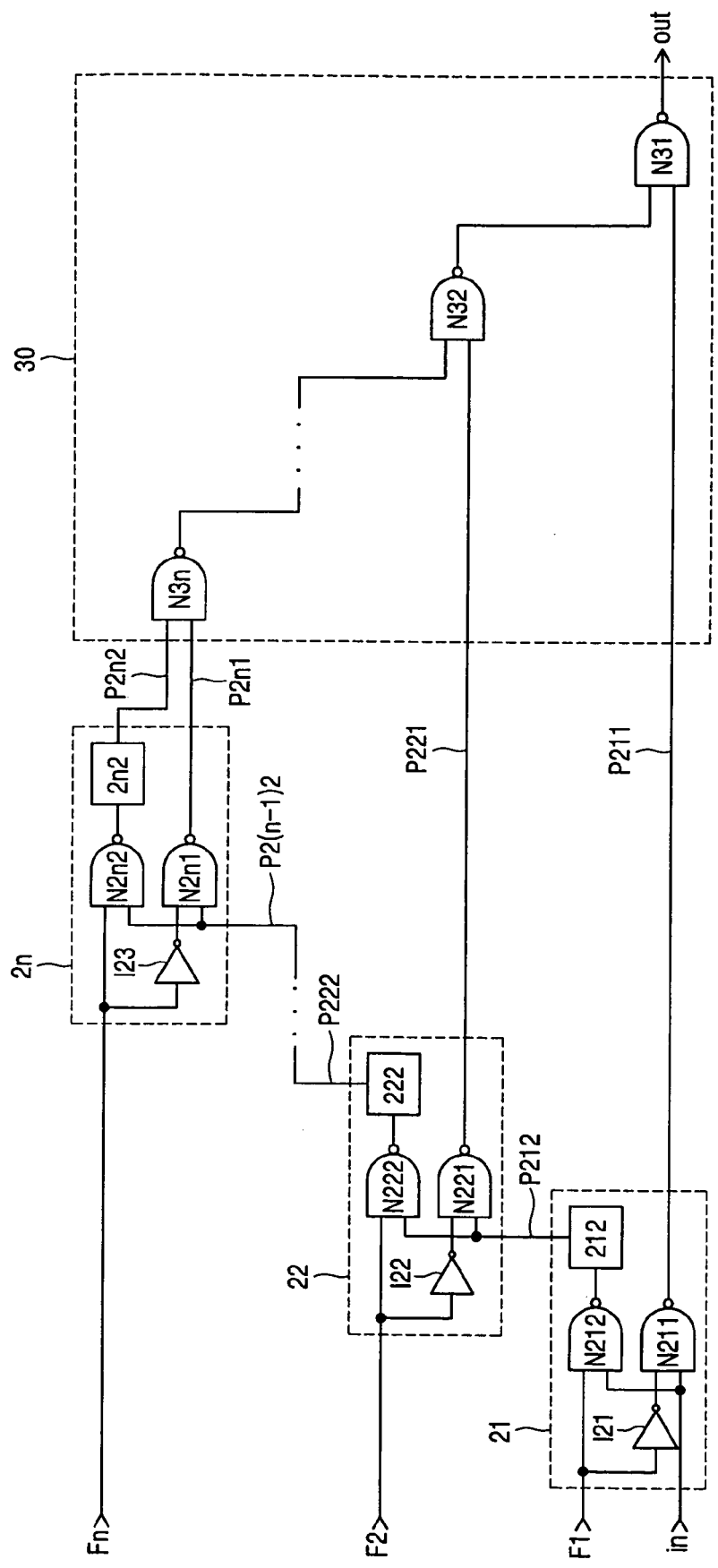
FIG. 5 is a circuit diagram illustrating the delay circuit of FIG. 4 in further detail.

FIG. 5 is a circuit diagram illustrating the delay circuit of FIG. 4 in further detail.

Referring to FIG. 5, switches 211 through 2n1 include respective inverters 121 through 12n for inverting control signals F1 through Fn, and first NAND gates N211 through N2n1 for computing a NAND operation on inverted control signals /F1 through /Fn and the respective input signals of delay blocks 21 through 2n and transmitting resulting output signals to first transmission paths P211 through P2n1. Switches 211 through 2n1 further include second NAND gates N212 through N2n2 for computing a NAND operation on control signals F1 through En and the input signals of respective delay blocks 21 through 2n and transmitting resulting output signals to second transmission paths P212 through P2n2. Unit delay cells 212 through 2n2 include elements (not shown) for delaying respective signals on second transmission paths P212 through P2n2 for a predetermined unit of time.

Driving portion 30 is connected to delay blocks 21 through 2n and includes NAND gates N31 through N3n. Each of NAND gates N31 through N3(n-1) computes a NAND operation on a respective signal transmitted via one of first transmission paths P211 through P2(n-1)1 and a signal output by a next one of NAND gates N32 through N3n. For example, NAND gate N31 computes a NAND operation on a signal transmitted via first transmission path P211 and a signal output by NAND gate N32. NAND gate N3n, on the other hand, computes a NAND operation on a signal transmitted via first transmission path P2n1 and a signal transmitted via second transmission path P2n2.

The operation of the delay circuit shown in FIG. 5 is described below with reference to FIG. 6.

Figure 6:
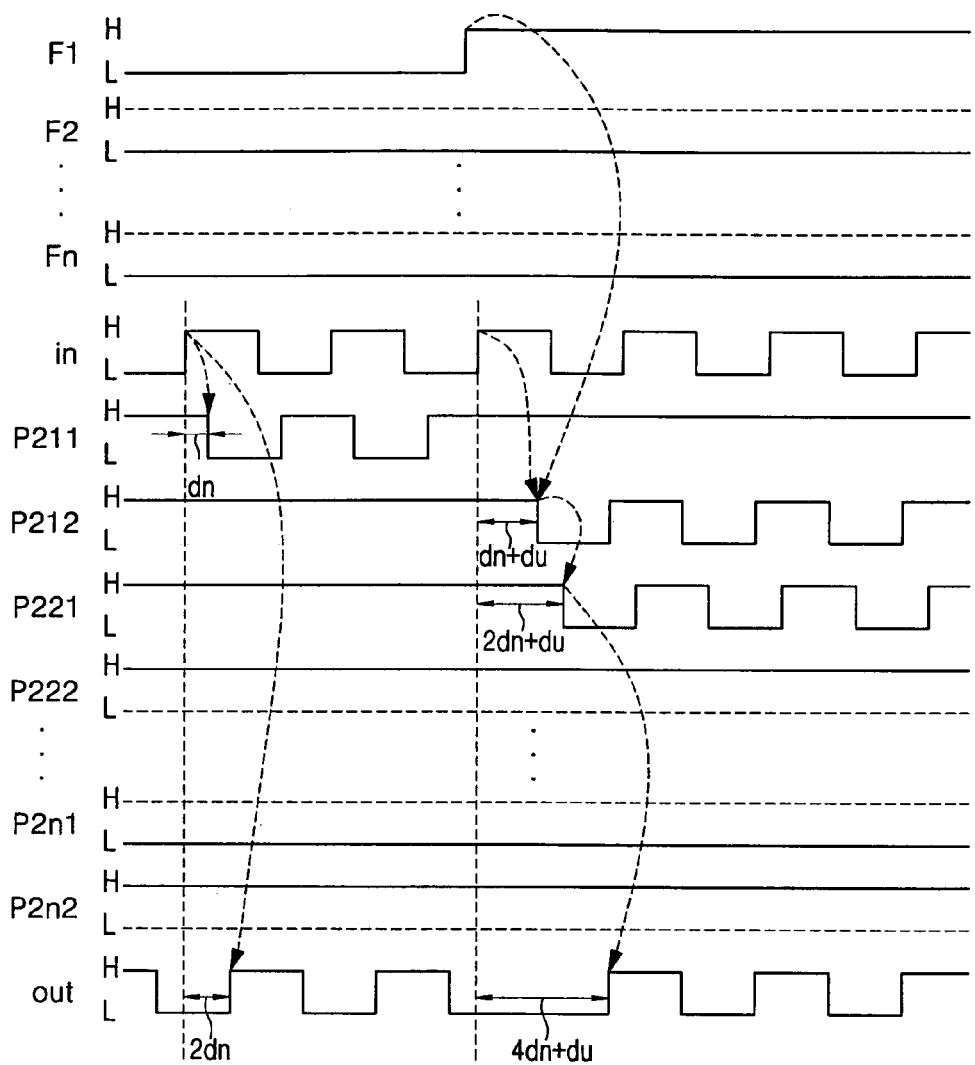
FIG. 6 is a timing diagram illustrating the operation of the delay circuit shown in FIG. 5.

In FIG. 6, it is assumed that a delay operation for a particular delay block is enabled when a corresponding control signal has logic level "high" (denoted "H" in FIG. 6), and the delay operation is disabled when the corresponding control signal has logic level "low" (denoted "L" in FIG. 6). In FIG. 6, "dn" denotes a delay associated with each NAND gate in FIG. 5, and "du" denotes a delay associated with each unit delay cell 212 through 2n2.

Referring to FIG. 6, control signals F1 through Fn initially have logic level "low" and therefore delay blocks 21 through 2n are disabled. As a result, the respective input signals for delay blocks 21 through 2n are delayed as follows.

First delay block 21 receives input signal "in", and generates an inverted input signal /in which is delayed by delay time "dn" through first NAND gate N211. First delay block 21 then transmits the resulting delayed and inverted signal to first transmission path P211, and generates a signal with logic level "high" through second NAND gate N212 and unit delay cell 212 and transmits the signal output by unit delay cell 212 to delay block 22 via second transmission path P212.

Second delay block 22 receives the signal transmitted via second transmission path P212 with logic level "high", generates a signal with logic level "low" through NAND gate N221, transmits the signal generated through NAND gate N221 to first transmission path P221, generates a signal having logic level "high" through second NAND gate N222 and unit delay cell 222, and transmits the signal generated through second NAND gate N222 and unit delay cell 222 to delay block 23 via second transmission path P222.

Delay blocks 23 through 2n receive signals output by respective delay blocks 22 through 2(n-1) via respective second transmission paths P222 through P2(n-1)2 and respective control signals F3 through Fn and operate in the same way as second delay block 22 to transmit a respective output signals with logic level "low" via first transmission paths P231 through P2n1 and respective output signals with logic level "high" to second transmission paths P232 through P2n2.

NAND gates N32 through N3n in driving portion 30 generate respective output signals with logic level "high" and NAND gate N31 generates an input signal in which is delayed by a delay time "2dn".

Thus, where all of delay blocks 21 through 2n are disabled, input signal "in" is delayed by a delay time "2dn" after being transmitted through first NAND gate N211 of first delay block 21 and NAND gate N31 of driving portion 30. In other words, a minimum delay time of the delay circuit is "2dn", which is generated by first NAND gate N211 of first delay block 21 and NAND gate N31 of driving portion 30.

Referring still to FIG. 6, first control signal F1 subsequently transitions to logic level "high" level to enable first delay block 21. As a result, input signal "in" is delayed as follows.

First delay block 21 receives input signal "in" and generates a signal having logic level "high" through first NAND gate N211. First delay block 21 then transmits the output by first NAND gate N211 via first transmission path P211, generates an inverted input signal /in which is delayed by a delay time "dn+du" through second NAND gate N212 and the unit delay cell 212, and transmits the resulting delayed and inverted signal to second transmission path P212.

Second delay block 22 receives the inverted and delayed signal, generates a signal which is delayed by a delay time "2dn+du" through first NAND gate N221, transmits the signal delayed by delay time "2dn+du" to first transmission path P221, generates a signal having logic level "high" through second NAND gate N222 and unit delay cell 222, and transmits the signal having logic level "high" to second transmission path P222.

Delay blocks 23 through 2n receive signals output by respective delay blocks 22 through 2(n=1) via respective second transmission paths P222 through P2(n-1)2 and respective control signals F3 through Fn and operate in the same way as second delay block 22 to transmit respective output signals with logic level "low" via first transmission paths P231 through P2n1 and respective output signals with logic level "high" via second transmission paths P232 through P2n2.

NAND gate N33 of driving portion 30 generates a signal having logic level "high", and NAND gate N32 generates an inverted input signal /in delayed by a delay time "3dn+du", and the NAND gate N31 generates an input signal delayed by a delay time "4dn+du".

Accordingly, where first delay block 21 is enabled, input signal "in" is delayed by a delay time "4dn+du" after being transmitted through first delay block 21, second delay block 22, and the NAND gates N212, N221, N31, and N32 of driving portion 30 and unit delay cell 212.

Similarly, where the delay circuit enables "m" delay blocks 21 through 2m, where "m" is a natural number greater than or equal to 1 and less than or equal to "n", input signal "in" is transmitted through enabled delay blocks 21 to 2m, delay block 2(m+1) connected to the output terminal of enabled delay block 2m, NAND gates N212 through N2 m2, N2(m+1)1, and N31 through N3m of driving portion 30, and unit delay cells 212 through 2 m2 so that the overall delay of input signal "in" is "2dn×(m+1)+du×m".

Figure 7:
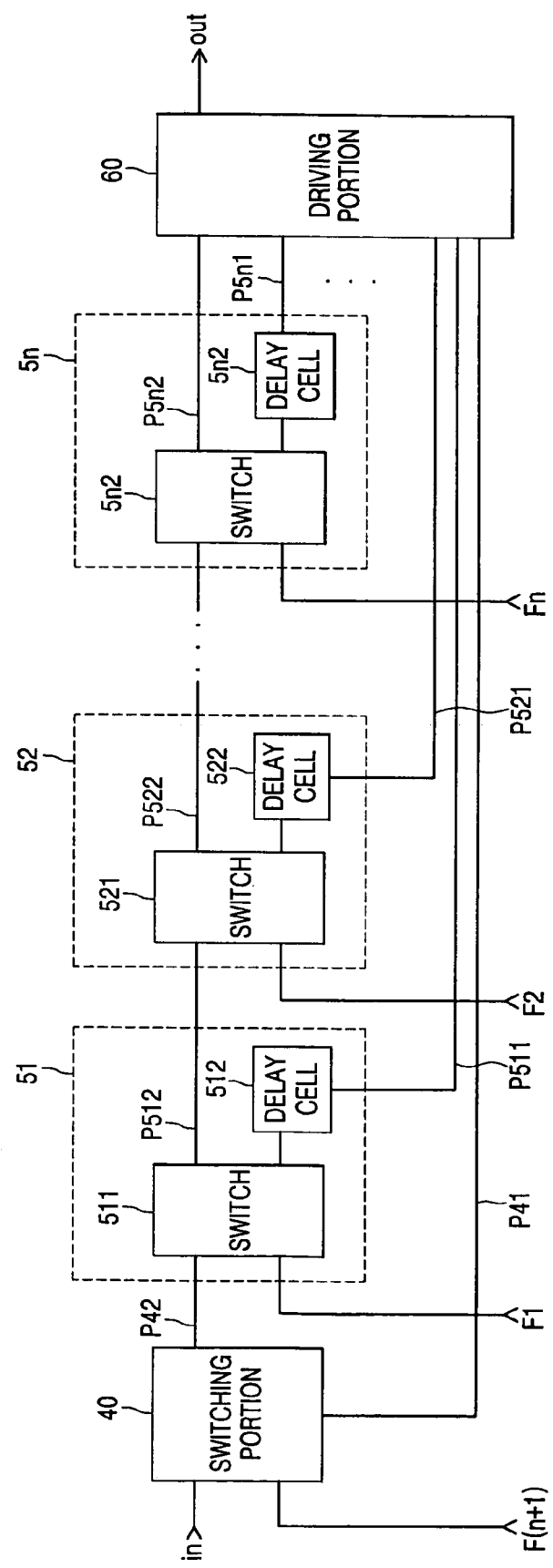
FIG. 7 is a block diagram illustrating a delay circuit according to another embodiment of the present invention.

FIG. 7 is a block diagram illustrating a delay circuit according to another embodiment of the present invention.

Referring to FIG. 7, the delay circuit comprises a switching portion 40, a plurality of delay blocks 51 through 5n which are serially connected to each other, a driving portion 60 which is connected in parallel to switching portion 40, and a plurality of delay blocks 51 through 5n. Delay blocks 51 through 5n include switches 511 through 5n1 and unit delay cells 512 to 5n2.

Switching portion 40 includes a first transmission path P41 directly connected to driving portion 60 and a second transmission portion P42 connected to a plurality of delay blocks 51 through 5n. Switching portion 40 selects whether to operate the whole delay circuit (i.e., delay blocks 51 through 5n) based on the logic level of control signal F(n+1). In particular, where delay circuit is disabled based on control signal F(n+1), switching portion 40 transmits input signal "in" to driving portion 60 through first transmission path P41. In contrast, where delay blocks 51 through 5n are enabled based on control signal F(n+1), switching portion 40 transmits input signal "in" to delay blocks 51 through 5n via first transmission path P42.

Delay blocks 51 through 5n are respectively connected to first transmission paths P511 through 5n1, which are directly connected to driving portion 60, and second transmission paths P512 through P5n2, which are connected to respective next delay blocks 52 through 5n. Delay block 51 receives an output signal from switching portion 40, and delay blocks 52 through 5n receive signals transmitted via respective second transmission paths P512 through P5(n−1)2. Where delay blocks 51 through 5n are disabled, the output signal from switching portion 40 is transmitted directly to driving portion 60 without delay. Otherwise, the output signal from switching portion 40 is delayed by at least one of delay blocks 51 through 5n.

In order to transmit signals directly between respective delay blocks 51 through 5n and driving portion 60, and between switching portion 40 and driving portion 60, switches 511 through 5n1 include first transmission paths P511 through P5n1, which are connected to driving portion 60 via respective delay cells 512 through 5n2, and second transmission paths P512 through P5n2, which are connected to respective subsequent delay blocks 52 through 5n. In addition, a signal is directly transmitted between switching portion 40 and driving portion 60 via first transmission path P41.

Where delay blocks 51 through 5n are enabled, switches 511 through 5n1 transmit signals received via respective second transmission paths P42 and P512 through P5(n−1)2 to respective second transmission paths P512 through P5n2. In contrast, where delay blocks 51 through 5n are disabled based on control signals F1 through Fn, switches 511 through 5n1 transmit signals received via respective second transmission paths P42 and P512 through P5(n−1)2 to driving portion 60 via respective first transmission paths P511 through P5n1. Delay cells 512 to 5n2 are connected to driving portion 60 through first transmission paths P511 through P5n1, and delay respective output signals of switches 511 through 5n1 for a unit of time and then transmit the resulting delayed signals to driving portion 60. Since delay block 5n is a last delay block, second transmission path 5n2 is connected to driving portion 60.

Driving portion 60 is connected in parallel with first transmission path P41, first transmission paths P511 to P5n1, and second transmission path P5n2, and combines signals transmitted via transmission paths P41, P511 through P5n1, and P5n2 to generate a time delayed output signal.

In FIG. 7, delay cells 512 through 5n2 in respective delay blocks 51 through 5n typically provide different delay times from each other. However, the delay cells can also provide the same delay time.

Figure 8:
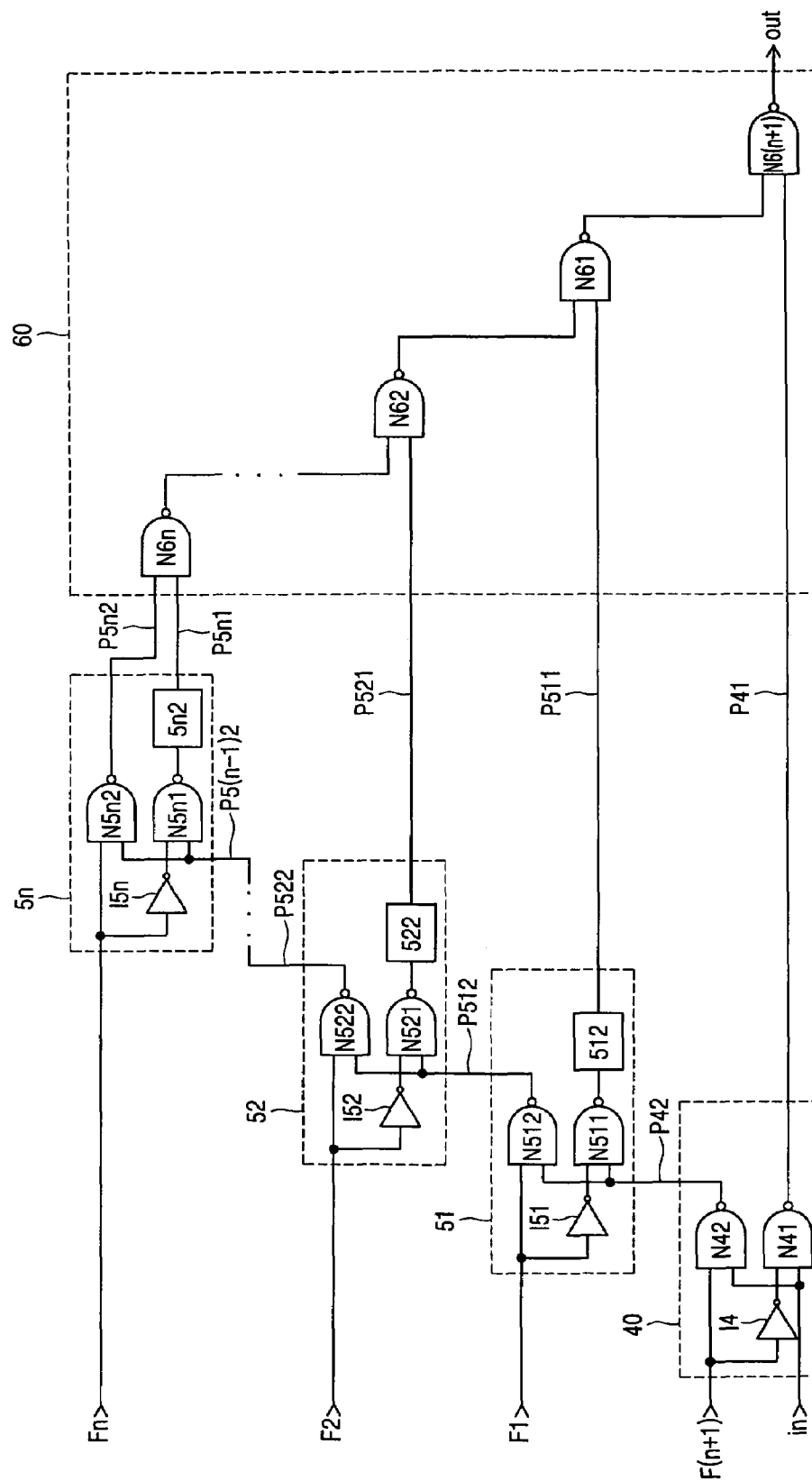
FIG. 8 is a circuit diagram illustrating the delay circuit of FIG. 7 in further detail.

FIG. 8 is a circuit diagram illustrating delay circuit of FIG. 7 in further detail.

Referring to FIG. 8, switching portion 40 comprises an inverter I4 for inverting control signal F(n+1), and a NAND gate N41 for computing a NAND operation on inverted control signal /F(n+1) and input signal "in" and transmitting a resulting output signal to first transmission path P41. Switching portion 40 further comprises a NAND gate N42 for computing a NAND operation on control signal F(n+1) and input signal "in", and transmitting a resulting output signal to second transmission path P42.

Switches 511 through 5n1 of respective delay blocks 51 through 5n comprise respective inverters 151 through 15n for inverting control signals F1 through Fn, and first NAND gates N511 through N5n1 for computing a NAND operation on inverted control signals /F1 through /Fn and respective output signals of switching portion 40 and delay blocks 51 through 5(n−1) and transmitting respective resulting output signals to first transmission paths P511 through P5n1. Switches 511 through 5n1 further comprise second NAND gates N512 through N5n2 for respectively computing NAND operations on control signals F1 through Fn and the output signal of switching portion 40 of delay blocks 51 through 5(n−1) and transmitting respective resulting output signals to second transmission paths P512 through P5n2. Unit delay cells 512 through 5n2 include elements (not shown) for delaying respective input signals for a predetermined unit of time.

Driving portion 60 includes NAND gates N61 through N(6n+1) for computing NAND operations on respective signals transmitted via first transmission P511 through P5n1 and P41 and signals output by upper adjacent NAND gates. For example, NAND gate N6(n+1) computes a NAND operation on the signal transmitted via first transmission path P41 and a signal output by NAND gate N61. As an exception, however, NAND gate N6n does not receive an input from an upper adjacent NAND gate. As a substitute, it uses an input from NAND gate N5n2 of delay block 5n to compute the NAND operation.

The operation of the delay circuit shown in FIG. 8 is explained below with reference to FIG. 9.

Figure 9:
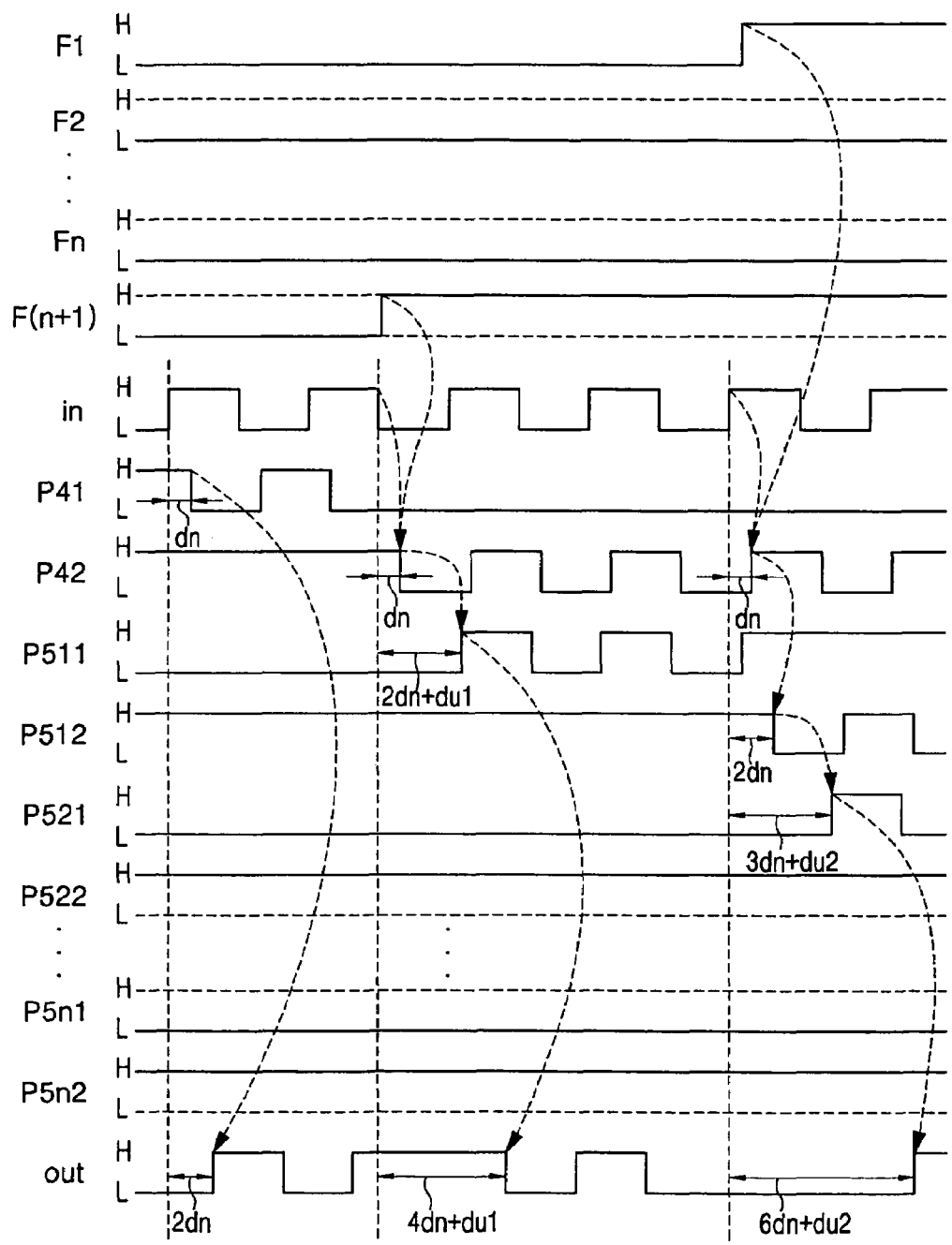
FIG. 9 is a timing diagram illustrating the operation of the delay circuit shown in FIG. 8.

In FIG. 9, it is assumed that a delay operation for a particular delay block is enabled when a corresponding control signal has logic level "high" (denoted "H" in FIG. 9), and the delay operation is disabled when the corresponding control signal has logic level "low" (denoted "L" in FIG. 9). In FIG. 9, "dn" denotes a delay associated with each NAND gate in FIG. 8, and "duk" denotes a delay associated with a k-th delay block and a unit delay cell 5k2.

Referring to FIG. 9, control signals F1 to F(n+1) initially all have logic level "low". As a result, switching portion 40 and delay blocks 51 through 5n delay input signal "in" as follows.

Switching portion 40 receives input signal "in", generates an inverted input signal /in which is delayed by delay time dn through NAND gate N41, and transmits a resulting delayed and inverted signal to first transmission path P41. In addition, switching portion 40 generates a signal having logic level "high" through NAND gate N42 and transmits the signal transmitted through NAND gate N42 via second transmission path P42.

Driving portion 60 is connected in parallel with first transmission path P41, first transmission paths P511 to P5n1, and second transmission path P5n2, and combines signals transmitted via transmission paths P41, P511 through P5n1, and P5n2 to generate a time delayed output signal.

NAND gates N61 through N6n of driving portion 60 receive the respective signals transmitted via first transmission paths P511 through P5n1 and having logic level "high" through the second transmission paths P512 through P5n2 and generate respective signals having logic level "high", and NAND gate N6(n+1) generates an output signal "out" which is delayed by a delay time "2dn" through NAND gates N41 and N6(N+1).

Thus, where switching portion 40 and all of delay blocks 51 through 5n are disabled, input signal "in" is delayed by a delay time "2dn" after being transmitted only through NAND gate N61 of switching portion 40 and NAND gate N6(n+1) of driving portion 60. In other words, a minimum delay time of the delay circuit shown in FIG. 8 is "2dn".

Subsequently, control signal F(n+1) transitions to logic level "high". As a result, switching portion 40 is enabled and input signal "in" is delayed as follows.

Switching portion 40 receives input signal "in", generates a signal having logic level "high" through NAND gate N41, and transmits the signal generated through NAND gate N41 to first transmission path P41. Switching portion 40 further generates an inverted input signal which is delayed by delay time dn through NAND gate N42 and transmits the delayed inverted signal via second transmission path P42.

First delay block 51 receives the signal transmitted via transmission path P42, generates an input signal which is delayed by a delay time "2dn+du1" through first NAND gate N511 and delay cell 512, and transmits the delayed signal via first transmission path P511. First delay block 51 further generates a signal having logic level "high" through NAND gate N51, transmits the signal generated through NAND gate N51 via second transmission path P512.

Delay blocks 52 through 5n receive respective signals transmitted via second transmission paths P512 through P5(n-1)2 and having logic level "high", and operate in the same way as delay block 51 to transmit respective signal having logic level "low" to respective first transmission paths P521 through P5n1 and respective signals having logic level "high" to second transmission paths P522 through P5n2.

NAND gates N62 through N6n of driving portion 60 generate an inverted input signal /in which is delayed by "3dn+du1", and NAND gate N6(n+1) generates input signal "in" delayed by a delay time "4dn+du1".

Thus, where switching portion 40 is enabled, input signal "in" is delayed by delay time "4dn+du1" after being transmitted through enabled switching portion 40, first delay block 51, NAND gates N41, N511, N61, and N6(n+1) of driving portion 60, and delay cell 512.

Then, when first control signal F1 transitions to logic level "high" to further enable first delay block 51, input signal "in" is delayed as follows.

Switching portion 40 operates as described above to transmit a signal having logic level "high" to first transmission path N41 and to transmit a delayed inverted input signal /in to second transmission path P42.

First delay block 21 receives delayed inverted input signal /in, generates a signal having logic level "low" through NAND gate N511 and delay cell 512, transmits the signal generated through NAND gate N511 and delay cell 512 to transmission path P511, and generates an input signal delayed by a delay time "2dn" through second NAND gate N512, and transmits the delayed input signal to second transmission path P512.

Second delay block 22 receives delayed input signal "in", which is delayed by a delay time "2dn", and generates an inverted input signal /in which is delayed by a delay time "3dn+du2" through NAND gate N521 and delay cell 522. Second delay block 22 then transmits inverted input signal \in generated through NAND gate N521 and delay cell 522 to first transmission path P521, generates a signal having logic level "high" through NAND gate N522 and transmits the signal generated through NAND gate N522 via second transmission path P522.

Delay blocks 53 through 5n receive respective signals transmitted via second transmission paths P532 through P5(n-1)2 and operate in the same way as delay block 51 to transmit respective signals having logic level "low" to respective first transmission paths P531 through P5n1 and a signal having logic level "high" to the second transmission paths P532 to P5n2.

NAND gates N63 through N6n of driving portion 60 generate signals having logic level "high", NAND gate N62 generates an input signal which is delayed by a delay time "4dn+du2", NAND gate N61 generates an inverted input signal /in which is delayed by a delay time "5dn+du2", and the NAND gate N6(n+1) generates an input signal which is delayed by a delay time "6dn+du2".

Thus, where switching portion 40 and delay block 51 are enabled, input signal "in" is delayed by a delay time "6dn+du2" after being transmitted through NAND gates N42, N512, N521, N61, N62, and N6(n+1) of enable switching portion 40, enabled delay block 51, second delay block 52, and driving portion 60, and delay cell 522.

In the same way as described above, the delay circuit may enable switching portion 40 and "m" delay blocks 51 through 5m (where "m" is a natural number greater than or equal to 1 and less than or equal to "n") according to the control signals and transmits input signal in through enabled switching portion 40, enabled delay blocks 51 to 5m, delay block 2(m+1) connected to an output terminal of enabled delay blocks 51 through 5m, NAND gates N42, N512 to N5(m)2, N5(m+1)1, N61 through N6(m+1), and N6(n+1) of the driving portion 60, and delay cell 5(m+1)2 to thereby delay input signal "in" by "2dn×(m+2)+du×(m+1)".

Figure 10:
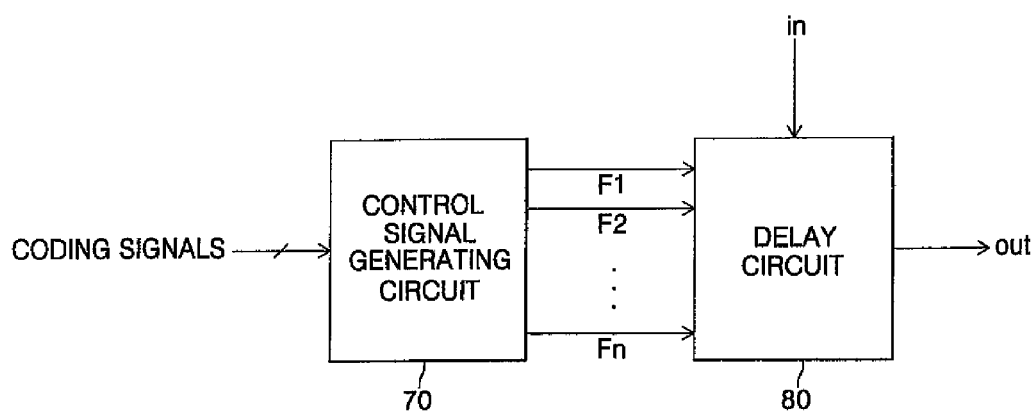
FIG. 10 is a block diagram illustrating a semiconductor device including a delay circuit according to an embodiment of the present invention.

FIG. 10 is a block diagram illustrating a semiconductor device including a delay circuit according to an embodiment of the present invention. The semiconductor device includes a control signal generating circuit 70 and a delay circuit 80 which has the same configuration as the delay circuit shown in FIG. 4. Accordingly, a detailed description of delay circuit 80 is omitted.

Control signal generating circuit 70 typically comprises a mode register set circuit. The mode register set circuit generates a plurality of control signals F1 through Fn, which control a time delay of delay circuit 80 in response to coding signals (e.g., command signals and address signals) transmitted from an external source.

Delay circuit 80 varies a number of delay blocks to be enabled in response to control signals F1 through Fn to thereby vary its delay time. As a result, delay circuit 80 delays an input signal "in" for a varied delay time to generate an output signal. In other words, delay circuit 80 transmits input signal "in" through the enabled delay blocks and the delay block connected to the output terminal of the enabled delay blocks and delays input signal "in" for a predetermined delay time to generate the output signal out as described with reference FIG. 4.

In other words, the semiconductor device of FIG. 10 varies the delay time of delay circuit 80 using control signals F1 through Fn and delays input signal "in" according to the varied delay time.

Control signal generating circuit 70 of FIG. 10 is implemented by the mode register set circuit; however, control signal generating circuit 70 can also be implemented using a plurality of fuse circuits if needed. That is, a plurality of fuse circuits are provided and controlled by a fuse program to generate a plurality of control signals.

The delay circuit described in relation to FIG. 4 is typically used as delay circuit 80 in FIG. 10; however, the delay circuit described in relation to FIG. 7 can also be implemented if needed.

As described above, a delay circuit according to various embodiments of the present invention transmits an input signal "in" only through selected delay blocks to prevent unnecessary delays, thereby stably supporting high performance operation of a semiconductor device.

In addition, the delay circuit maintains a constant minimum delay time regardless of the number of the delay blocks, so that it is possible to increase the number of delay blocks without changing the minimum delay time of the delay circuit. As a result, input signal "in" of the delay circuit can be delayed for a desired time, and a characteristic margin between various signals in the semiconductor device can be optimized.

The foregoing exemplary embodiments are teaching examples. Those of ordinary skill in the art will understand that various changes in form and details may be made to the exemplary embodiments without departing from the scope of the present invention as defined by the following claims.

What is claimed:

1. A delay circuit, comprising:
   a plurality of delay blocks connected in series; and,
   a driving portion adapted to logically combine output signals transmitted from the plurality of delay blocks to generate a delay circuit output signal;
   wherein each of the plurality of delay blocks receives an input signal and delays the input signal to produce a first output signal where a delay operation of the delay block is enabled based on a corresponding control signal, and outputs the input signal as a second output signal where the delay operation of the delay block is disabled based on the corresponding control signal; and,
   wherein each of the plurality of delay blocks receives the first output signal of an immediately previous delay block as its input signal and the driving portion receives the second output signals of each of the plurality of delay blocks.

2. The circuit of claim 1, wherein each of the plurality of delay blocks comprises:
   a unit delay cell adapted to delay the input signal of the delay block for a predetermined delay time to produce a delayed input signal as the first output signal of the delay block and further adapted to transmit the delayed input signal to a next delay block; and,
   a switching portion adapted to transmit the input signal of the delay block to the next delay block via the unit delay cell where the delay operation of the delay block is enabled based on the corresponding control signal, and further adapted to transmit the input signal of the delay block to the driving portion as the second output signal of the delay block where the delay operation of the delay block is disabled based on the corresponding control signal.

3. The circuit of claim 2, wherein the unit delay cell of a last delay block among the plurality of delay blocks outputs its first output signal to the driving portion.

4. The circuit of claim 2, wherein the switching portion comprises:
   an inverter adapted to invert the corresponding control signal to produce an inverted control signal;
   a first logical gate adapted to logically combine the inverted control signal and the input signal of the delay block to generate the second output signal of the delay block; and,
   a second logical gate adapted to logically combine the corresponding control signal and the input signal of the delay block to generate an input signal for the unit delay cell.

5. The circuit of claim 2, wherein the driving portion comprises:
   a plurality of logical gates respectively corresponding to the plurality of delay blocks, wherein each of the plurality of logical gates logically combines the second output signal of a corresponding delay block among the plurality of delay blocks and a signal transmitted from one of the plurality of logical gates corresponding to a next delay block among the plurality of delay blocks to generate a logic gate output signal.

6. The circuit of claim 5, wherein one of the plurality of logical gates corresponds to a last delay block among the plurality of delay blocks; and,
   the logical gate corresponding to the last delay block logically combines a signal transmitted from the switching portion of the last delay block and a signal transmitted from the unit delay cell of the last delay block to generate the delay circuit output signal.

7. A delay circuit, comprising:
   a plurality of delay blocks connected in series; and,
   a driving portion adapted to logically combine output signals transmitted from the plurality of delay blocks to generate a delay circuit output signal;
   wherein each of the plurality of delay blocks receives an input signal and delays the input signal for a first delay period to produce a delayed input signal and outputs the delayed input signal to the driving portion where a delay operation of the delay block is enabled based on a corresponding control signal, and outputs the input signal to the next delay block without delaying the input signal for the first delay period where the delay operation of the delay block is disabled based on the corresponding control signal.

8. The circuit of claim 7, further comprising:
   a first switching portion adapted to transmit a delay circuit input signal to a first delay block among the plurality of delay blocks where a delay operation of the first delay block is enabled based on a first control signal associated with the first switching portion, and further adapted to transmit the delay circuit input signal to the driving portion when the delay operation of the first delay block is disabled based on the first control signal.

9. The circuit of claim 8, wherein the first switching portion comprises:
   an inverter adapted to invert the first control signal to produce an inverted first control signal;

a first logical gate adapted to logically combine the inverted first control signal and the delay circuit input signal to generate a first output signal, and further adapted to transmit the first output signal to the driving portion; and, a second logical gate adapted to logically combine the first control signal and the delay circuit input signal to generate a second output signal, and further adapted to transmit the second output signal to the plurality of delay blocks.

10. The circuit of claim 9, wherein each of the plurality of delay blocks comprises:

a unit delay cell adapted to delay the input signal of the delay block for the first delay period to produce the delayed input signal, and further adapted to transmit the delayed input signal to a next delay block among the plurality of delay blocks; and, a switching portion adapted to transmit the input signal of the delay block to the next delay block when a delay operation of the delay block is enabled based on the corresponding control signal, and further adapted to transmit the input signal of the delay block to the driving portion when the delay operation of the delay block is disabled based on the control signal.

11. The circuit of claim 10, wherein the respective unit delay cells of the plurality of delay blocks provide different delay times.

12. The circuit of claim 10, wherein the respective unit delay cells of the plurality of delay blocks provide the same delay times.

13. The circuit of claim 10, wherein the unit delay cell of a last delay block among the plurality of delay blocks delays its input signal for a predetermined delay time and transmits a resulting delayed input signal to the driving portion.

14. The circuit of claim 12, wherein the switching portion of each delay block comprises:

an inverter adapted to invert the control signal corresponding to the delay block to produce an inverted control signal;

a first logical gate adapted to logically combine the inverted control signal and the input signal of the delay block to generate a first output signal, and further adapted to transmit the first output signal to the driving portion; and, a second logical gate adapted to logically combine the control signal corresponding to the delay block and the input signal of the delay block to generate a second output signal, and further adapted to transmit the second output signal to the unit delay cell of the delay block.

15. The circuit of claim 10, wherein the driving portion comprises:

a plurality of logical gates respectively corresponding to the first switching portion and the plurality of delay blocks, wherein each of the plurality of logical gates, except for a last logic gate corresponding to a last delay block among the plurality of delay blocks, logically combines a signal transmitted from the first switching portion or the switching portion of its corresponding delay block and a signal transmitted from one of the plurality of logical gates corresponding to a next delay block among the plurality of delay blocks to generate the delay circuit output signal.

16. The circuit of claim 15, wherein the last logic gate logically combines a signal transmitted from the switching portion of the last delay block, and a signal transmitted from the unit delay portion of the last delay block to generate the delay circuit output signal.

17. A semiconductor device, comprising:

a delay circuit comprising a plurality of delay blocks connected in series and a driving portion, and adapted to select a subset of delay blocks among the plurality of delay blocks based on a plurality of control signals, and further adapted to delay a delay circuit input signal through the subset of delay blocks; and, a control signal generating circuit comprising a mode rectifier set circuit and adapted to generate the plurality of control signals for selecting the subset of delay blocks based on externally provided coding signals;

wherein the driving portion is adapted to logically combine output signals transmitted from the plurality of delay blocks to generate a delay circuit output signal.

18. The device of claim 17, wherein each of the plurality of delay blocks receives an input signal and delays the input signal to produce a first output signal where a delay operation of the delay block is enabled based on a corresponding control signal, and outputs the input signal as a second output signal where the delay operation of the delay block is disabled based on the corresponding control signal; and, wherein each of the plurality of delay blocks receives the first output signal of an immediately previous delay block as its input signal and the driving portion receives the second output signals of each of the plurality of delay blocks.

19. The device of claim 17, wherein each of the plurality of delay blocks receives an input signal and delays the input signal to produce a delayed input signal and outputs the delayed input signal to a next delay block among the plurality of delay blocks where a delay operation of the delay block is enabled based on a corresponding control signal, and outputs the input signal to the next delay block where the delay operation of the delay block is disabled based on the corresponding control signal.

* * * * *